(12) United States Patent
Brechignac

(10) Patent No.: US 6,374,486 B1
(45) Date of Patent: Apr. 23, 2002

(54) SMART CARD AND PROCESS FOR MANUFACTURING THE SAME

(75) Inventor: Rémi Brechignac, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/356,840

(22) Filed: Jul. 19, 1999

(30) Foreign Application Priority Data

Jul. 20, 1998 (FR) .............................................. 98-09199

(51) Int. Cl.$^7$ ................................................. H05K 3/34
(52) U.S. Cl. ............................. 29/840; 29/827; 29/846; 235/488; 235/492; 257/679; 361/784
(58) Field of Search .......................... 29/840, 841, 831, 29/827, 846; 235/488, 492; 257/679; 361/784

(56) References Cited

U.S. PATENT DOCUMENTS

| | | | |
|---|---|---|---|
| 4,216,577 A | * | 8/1980 | Badet et al. |
| 4,460,825 A | * | 7/1984 | Haghirr-Tehrani et al. ..... 29/827 |
| 4,746,392 A | * | 5/1988 | Hoppe .......................... 29/827 |
| 4,835,846 A | * | 6/1989 | Juan et al. ..................... 29/827 |

FOREIGN PATENT DOCUMENTS

| | | |
|---|---|---|
| DE | 4431 605 A1 | 3/1996 |
| EP | 0 671 705 A2 | 9/1995 |
| EP | 0 706 152 A2 | 4/1996 |
| EP | 0 737 935 A2 | 10/1996 |
| FR | 2 756 955 A | 6/1998 |

OTHER PUBLICATIONS

French Search Report dated Apr. 29, 1999 with annex on French Application No. 98–09199.

* cited by examiner

*Primary Examiner*—Carl J. Arbes
(74) *Attorney, Agent, or Firm*—Lisa K. Jorgenson; Stephen Bongini; Fleit, Kain, Gibbons, Gutman & Bongini P.L.

(57) ABSTRACT

A method for manufacturing a smart card in which a through-passage is produced in a central sheet. At least one face of the central sheet is provided with at least one metal coil having connection parts, and an electronic chip having electrical connection pads is inserted into the passage. At least some of the electrical connection pads of the chip are soldered to the connection parts of the coil, and the faces of the central sheet are provided with external covering sheets to form a stack of sheets. In a preferred method, the stack of sheets is hot pressed or laminated such that the material of the sheets is flowed and fills the space around the chip. A smart card is also provided. The smart card includes at least one metal coil having at least two connection parts, an electronic chip connected to the connection parts of the coil, a central sheet having a through-passage, and external covering sheets that grip the central sheet. The electronic chip is placed in the passage in the central sheet. In one preferred embodiment, the central sheet and the covering sheets form a single entity in which the chip and the coil are completely embedded.

23 Claims, 2 Drawing Sheets

SMART CARD AND PROCESS FOR MANUFACTURING THE SAME

CROSS-REFERENCE TO RELATED APPLICATIONS

This application is based upon and claims priority from prior French Patent Application No. 98-09199, filed Jul. 20, 1998, the entire disclosure of which is herein incorporated by reference.

BACKGROUND OF THE INVENTION

1. Field of the Invention

The present invention relates to smart cards, and more specifically to contactless smart cards and a process for manufacturing the same.

2. Description of Related Art

Contactless smart cards are plastic cards containing an antenna in the form of a metal coil and an electronic module that is electrically connected to the antenna. The module includes a support and connection package containing an electronic chip. Such contactless smart cards are increasingly being manufactured and used.

At the present time, in order to manufacture such smart cards, a metal coil is formed on one side of a solid sheet of plastic and a parallelepipedal electronic module is placed on this sheet to form an additional thickness. A solder material is interposed between the connection pads of the module and the end of the coil. This assembly is sandwiched between two covering sheets of plastic, and portions are hot laminated in order to produce a card. In another manufacturing process, the electronic module has a part that extends into a through-passage in the central sheet and a collar that ends up as an additional thickness facing the sheet and having connection pads soldered to the coil.

It has been observed that such laminating generates tensile forces in the spots of solder so that after laminating, pockets not filled with material remain around the module. This results in weakened electrical connections between the module and the metal coil. Further, these pockets are likely to cause moisture retention to the detriment of the module, the metal coil, and their electrical connections. To avoid such problems, it is necessary to fill the interstices between the module and the central sheet with a suitable fluid resin before the central sheet is sandwiched between the two covering sheets and before the lamination.

The above conventional smart card manufacturing techniques require the use of low temperature bonding adhesives that are not very reliable and require the application of a filling resin in order to overcome the problems of stresses after laminating the sheets and of moisture. As a result, relatively thick cards are obtained due to the additional thickness introduced by the electronic module.

SUMMARY OF THE INVENTION

In view of these drawbacks, it is an object of the present invention to overcome the above-mentioned drawbacks and to provide an improved process for manufacturing smart cards.

Another object of the present invention is to provide an improved smart card.

One embodiment of the present invention provides a method for manufacturing a smart card. According to the method, a through-passage is produced in a central sheet. At least one face of the central sheet is provided with at least one metal coil having connection parts, and an electronic chip having electrical connection pads is inserted into the passage. At least some of the electrical connection pads of the chip are soldered to the connection parts of the coil, and the faces of the central sheet are provided with external covering sheets to form a stack of sheets. In a preferred method, the stack of sheets is hot pressed or laminated such that the material of the sheets is flowed and fills the space around the chip.

Another embodiment of the present invention provides a smart card. The smart card includes at least one metal coil having at least two connection parts, an electronic chip connected to the connection parts of the coil, a central sheet having a through-passage and the metal coil on one face, and external covering sheets that grip the central sheet. The electronic chip is placed in the passage in the central sheet. In one preferred embodiment, the central sheet and the covering sheets form a single entity in which the chip and the coil are completely embedded.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 6:
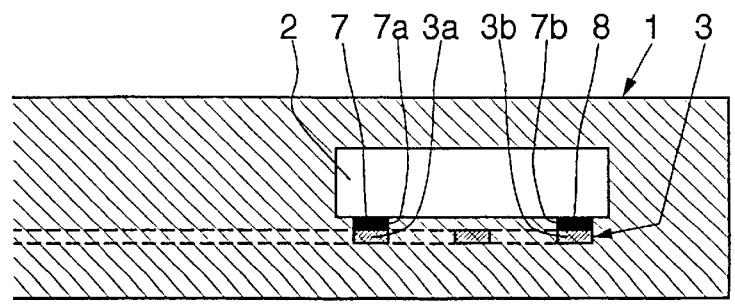
FIG. 6 shows a section corresponding to that of FIG. 5 with the smart card according to the preferred embodiment at the end of manufacture.

FIG. 6 shows a smart card according to a preferred embodiment of the present invention. As shown, the card I contains an electronic chip 2 that is placed near one side of the card and electrically connected to a metal coil 3. The metal coil 3 forms an antenna that extends near the periphery of the card 1. Such a smart card 1 is preferably manufactured in the following manner.

Figure 1:
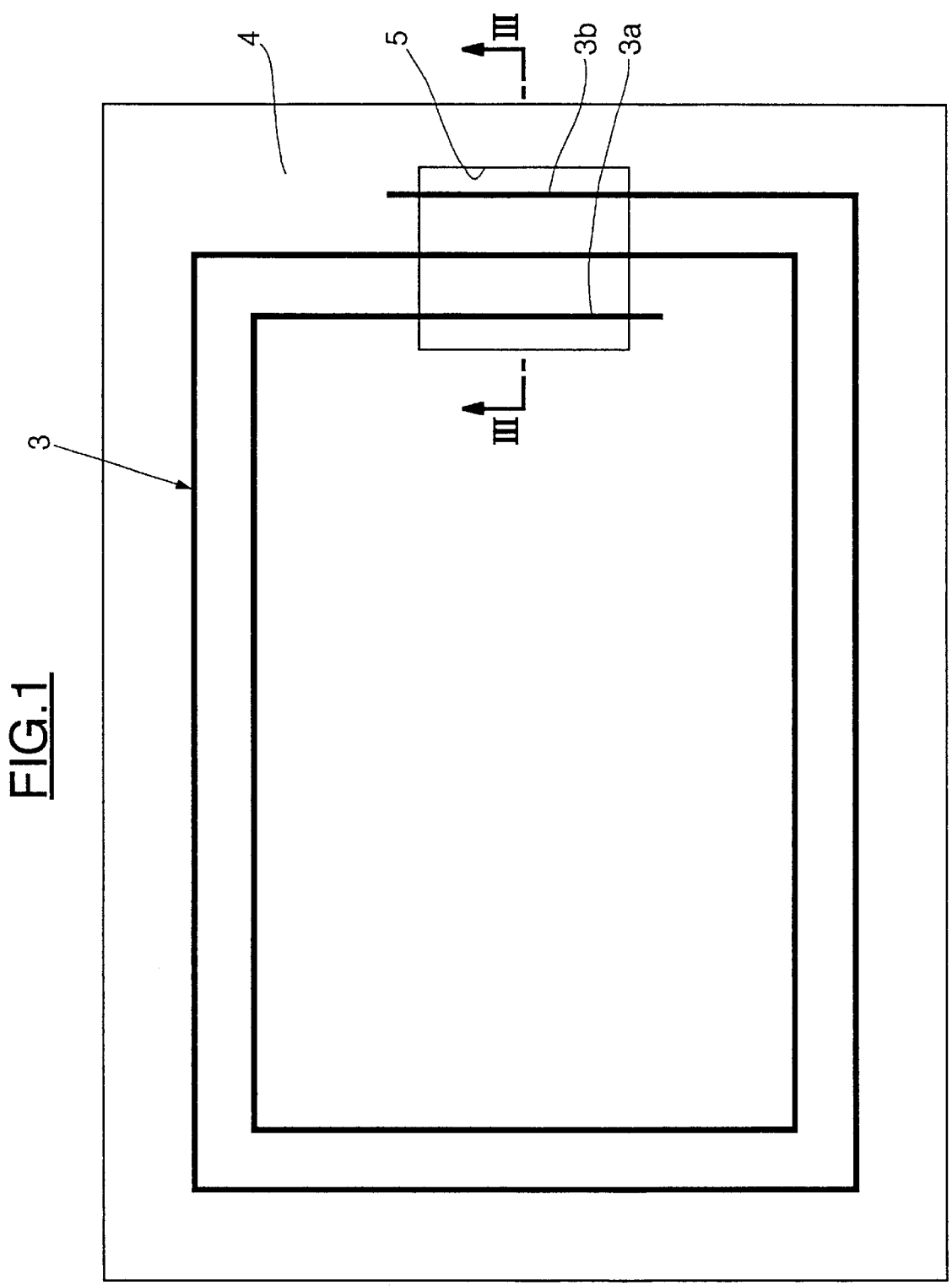
FIG. 1 shows a view of one face of a central sheet of a smart card according to a preferred embodiment of the present invention.
Figure 2:
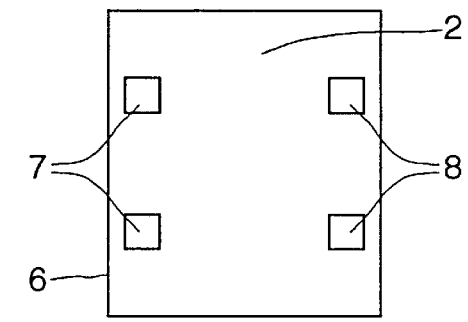
FIG. 2 shows a view of one face of an electronic chip to be inserted in the smart card.

With reference to FIG. 1, the preferred manufacturing process involves taking a sheet 4 of plastic (e.g., polyvinyl chloride) on one face of which the metal coil 3 is placed. A through-passage 5 is produced in the face such that the coil 3 has free connection parts 3*a* and 3*b* that run substantially parallel to each other past the passage 5 and that are at a short distance from its ends. In the illustrated embodiment, the coil 3 makes two turns and is formed by a layer or strip of copper deposited on the sheet 4. FIG. 2 shows the electronic chip 2, which is naked or as-produced (i.e., it is not fitted into a protection and connection package) and in the form of a parallelepiped having a rectangular perimeter 6 and pairs of pads 7 and 8 on one of its faces.

Figure 3:
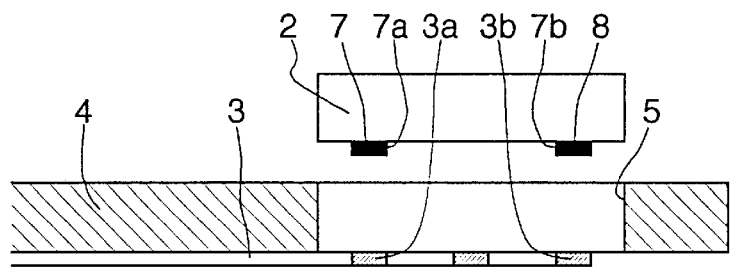
FIG. 3 shows a partial cross-section on line III—III of FIG. 1 with the chip in the mounting position.
Figure 4:
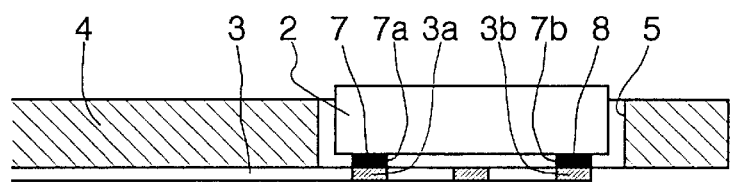
FIG. 4 shows a cross-section corresponding to that of FIG. 3 with the electronic chip mounted.

The dimensions of the passage 5 in the central sheet 4 are such that the passage can accommodate the electronic chip 2 and leave a space between the perimeter 6 of the chip and the side walls of the passage 5. As shown in succession in FIGS. 3 and 4, drops 7a and 7b of a solder material (e.g., tin-lead solder) are deposited on the pads 7 and 8 of the electronic chip 2, and then the chip is inserted into the passage 5 in the central sheet 4, with the face having the pads 7 and 8 being inserted first. The chip is inserted into the passage 5 as far as those connection parts 3a and 3b of the coil 3 that extend past that face of the electronic chip 2 and past the connection pads so that a uniform space is left between the perimeter 6 of the electronic chip 2 and the side walls of the passage 5.

Figure 5:
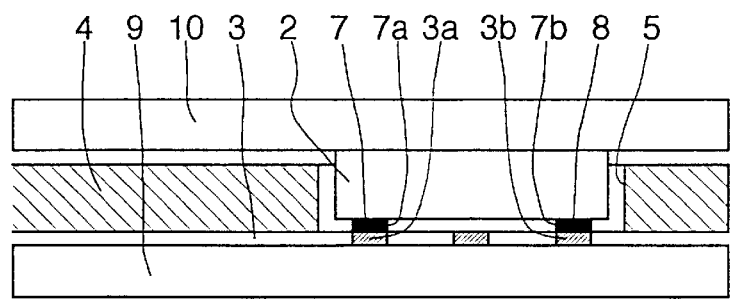
FIG. 5 shows a view corresponding to that of FIG. 4 with two opposed covering sheets in the mounting position.

Next, the connection pads 7 and 8 are hot soldered to the connection parts 3a and 3b of the metal coil 3 using the drops of solder material 7a and 7b. As shown in FIG. 5, covering sheets 9 and 10 of plastic (e.g., polyvinyl chloride) are then placed on the opposite faces of the central sheet 4. Thereafter, the fabrication process continues in the conventional manner by hot pressing or laminating the stack formed by the central sheet 4 and the covering sheets 9 and 10 so as to produce the smart card 1 of FIG. 6. During the laminating or pressing operation, the sheets 4, 9, and 10 flow and completely fill the space surrounding the electronic chip 2 and the metal coil 3, especially in the passage 5, so as to leave no interstice without any material. As shown in FIG. 6, after laminating or pressing, the central sheet 4 and the covering sheets 9 and 10 preferably form a single entity in which the electronic chip and the metal coil 3 are completely embedded.

According to the present invention, the chip 2 is inserted into the passage 5 in the central sheet 4 so no part of the chip faces the faces of the central sheet 4. Further, the connection parts 3a and 3b of the metal coil 3 extend directly past one face of the electronic chip 2. As a result, it is possible to produce a smart card 1 that is of reduced thickness and robust, especially in the region of the electrical connections between the pads 7 and 8 and the connection parts 3a and 3b. Additionally, such connections are protected from moisture because there are no interstices around the electronic chip 2 and the metal coil 3.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for manufacturing a smart card, said method comprising the steps of:
    producing a through-passage in a central sheet;
    providing at least one face of the central sheet with at least one metal coil having connection parts that each intersect two opposed sides of the through-passage in the central sheet so as to extend completely across the through-passage;
    inserting an electronic chip into the passage, the chip having electrical connection pads on at least one face;
    soldering at least some of the electrical connection pads of the chip to the connection parts of the coil;
    providing the faces of the central sheet with external covering sheets to form a stack of sheets; and
    hot pressing or laminating the stack of sheets such that the material of the sheets is flowed and completely fills the space around the chip.

2. The method as defined in claim 1, further comprising the step of embedding the chip and at least the connection parts of the coil in the material of at least one of the sheets of the stack.

3. The method as defined in claim 1, wherein in the step of hot pressing or laminating, the central sheet and the covering sheets are made to form a single entity in which the chip and the coil are completely embedded.

4. The method as defined in claim 1, wherein each of the connection parts is a free end of the metal coil that traverses the through-passage in the central sheet and ends in the vicinity of the edge of the through-passage.

5. A machine-readable medium encoded with a program for controlling at least one manufacturing machine in order to fabricate a smart card, said program containing instructions for performing the steps of:
    producing a through-passage in a central sheet;
    providing at least one face of the central sheet with at least one metal coil having connection parts that go past the passage;
    inserting an electronic chip into the passage, the chip having electrical connection pads on at least one face;
    soldering at least some of the electrical connection pads of the chip to the connection parts of the coil; and
    providing the faces of the central sheet with external covering sheets to form a stack of sheets.

6. The machine-readable medium as defined in claim 5, wherein said program further contains instructions for performing the step of embedding the chip and at least the connection parts of the coil in the material of at least one of the sheets of the stack.

7. The machine-readable medium as defined in claim 5, wherein said program further contains instructions for performing the step of hot pressing or laminating the stack of sheets such that the material of the sheets is flowed and fills the space around the chip.

8. The machine-readable medium as defined in claim 7, wherein in the step of hot pressing or laminating, the central sheet and the covering sheets are made to form a single entity in which the chip and the coil are completely embedded.

9. A method for manufacturing a smart card, said method comprising the steps of:
    producing a through-passage in a central sheet;
    providing at least one face of the central sheet with at least one metal coil having connection parts that go past the passage;
    inserting an electronic chip into the passage such that the chip is substantially contained within the passage in the central sheet, the chip having electrical connection pads on at least one face;
    soldering at least some of the electrical connection pads of the chip to the connection parts of the coil; and providing the faces of the central sheet with external covering sheets to form a stack of sheets.

10. The method as defined in claim 9, wherein the step of providing at least one face of the central sheet with at least one metal coil includes the sub-step of locating the connection parts of the metal coil such that each intersects two opposed sides of the through-passage in the central sheet so as to extend completely across the through-passage.

11. The method as defined in claim 10, wherein each of the connection parts is a free end of the metal coil that traverses the through-passage in the central sheet and ends in the vicinity of the edge of the through-passage.

12. The method as defined in claim 9, further comprising the step of hot pressing or laminating the stack of sheets such that the material of the sheets is flowed and completely fills the space around the chip.

13. The method as defined in claim 12, wherein in the step of hot pressing or laminating, the central sheet and the covering sheets are made to form a single entity in which the chip and the coil are completely embedded.

14. The method as defined in claim 9, wherein the central sheet is at least substantially as thick as the chip.

15. The method as defined in claim 9, wherein the central sheet and the chip have substantially the same thickness.

16. The method as defined in claim 9, further comprising the step of embedding the chip and at least the connection parts of the coil in the material of at least one of the sheets of the stack.

17. A smart card comprising:
   at least one metal coil having at least two connection parts;
   an electronic chip connected to the connection parts of the coil;
   a central sheet having a through-passage and the metal coil on one face, each of the connection parts of the metal coil intersecting two opposed sides of the through-passage in the central sheet so as to extend completely across the through-passage; and
   external covering sheets that grip the central sheet,
   wherein said smart card is manufactured by a method comprising the steps of:
      producing the through-passage in the central sheet;
      providing the one face of the central sheet with the metal coil;
      inserting the electronic chip into the passage, the chip having electrical connection pads on at least one face;
      soldering at least some of the electrical connection pads of the chip to the connection parts of the coil; and
      covering the faces of the central sheet with the external covering sheets so as to form a stack of sheets.

18. The smart card as defined in claim 17, wherein each of the connection parts is a free end of the metal coil that traverses the through-passage in the central sheet and ends in the vicinity of the edge of the through-passage.

19. The smart card as defined in claim 17, wherein said smart card is manufactured by a method further comprising the step of hot pressing or laminating the stack of sheets such that the material of the sheets is flowed and completely fills the space around the chip.

20. The smart card as defined in claim 19, wherein in the step of hot pressing or laminating, the central sheet and the covering sheets are made to form a single entity in which the chip and the coil are completely embedded.

21. The smart card as defined in claim 17, wherein the chip is substantially contained within the passage in the central sheet.

22. The smart card as defined in claim 17, wherein the central sheet is at least substantially as thick as the chip.

23. The smart card as defined in claim 19, wherein said smart card is manufactured by a method further comprising the step of embedding the chip and at least the connection parts of the coil in the material of at least one of the sheets of the stack.

* * * * *